(12) United States Patent
Izradel

(10) Patent No.: US 10,920,945 B2
(45) Date of Patent: Feb. 16, 2021

(54) SOLAR LED LIGHT BULB

(71) Applicant: Gama Sonic USA, Inc., Atlanta, GA (US)

(72) Inventor: Lazar Izradel, Tel Aviv (IL)

(73) Assignee: Gama Sonic USA, Inc., Norcross, GA (US)

(*) Notice: Subject to any disclaimer, the term of this patent is extended or adjusted under 35 U.S.C. 154(b) by 236 days.

(21) Appl. No.: 16/031,195

(22) Filed: Jul. 10, 2018

(65) Prior Publication Data
US 2020/0018454 A1 Jan. 16, 2020

(51) Int. Cl.
| | |
|---|---|
| *F21S 9/00* | (2006.01) |
| *F21S 9/03* | (2006.01) |
| *F21V 3/02* | (2006.01) |
| *F21Y 115/10* | (2016.01) |
| *F21V 15/02* | (2006.01) |
| *F21W 131/103* | (2006.01) |
| *F21W 131/109* | (2006.01) |
| *H02S 40/38* | (2014.01) |

(52) U.S. Cl.
CPC ............ *F21S 9/037* (2013.01); *F21V 3/02* (2013.01); *F21V 15/02* (2013.01); *F21W 2131/103* (2013.01); *F21W 2131/109* (2013.01); *F21Y 2115/10* (2016.08); *H02S 40/38* (2014.12)

(58) Field of Classification Search
CPC .... F21S 9/037; F21S 9/035; F21S 9/03; F21S 9/02; F21V 3/02; F21V 15/02; F21V 13/04; F21V 17/105; F21V 17/002; F21V 5/04; H02S 40/38; F21W 2131/109; F21W 2131/103; F21W 2131/10; F21W 2131/00; F21Y 2115/10; F21Y 2101/02; F21L 4/08; F21L 4/00; F21L 4/02; B60Q 1/00; G08C 17/00; G08C 17/02; G08C 17/04; H04N 2005/4407; H05B 33/0842; H05B 37/0218
USPC ................................ 362/183, 173, 295, 297
See application file for complete search history.

(56) References Cited

U.S. PATENT DOCUMENTS

| | | | | |
|---|---|---|---|---|
| 4,918,357 A * | 4/1990 | Waterbury | ............. | H05B 37/02 136/251 |
| 9,115,856 B1 * | 8/2015 | Robinson | ................. | F21L 4/08 |
| 2006/0227542 A1 * | 10/2006 | Richmond | .......... | F21V 21/0824 362/183 |
| 2008/0092800 A1 * | 4/2008 | Smith | ............... | H05B 33/0842 116/202 |
| 2012/0327660 A1 * | 12/2012 | Lin | ......................... | F21S 9/037 362/253 |

* cited by examiner

*Primary Examiner* — William J Carter
*Assistant Examiner* — Omar Rojas Cadima
(74) *Attorney, Agent, or Firm* — Dekel Patent Ltd.; David Klein

(57) ABSTRACT

A light bulb includes a light bulb body that has a bulbous portion that narrows into a neck portion. The neck portion extends into a base portion. An array of LEDs is mounted in the bulbous portion. One or more solar photovoltaic panels are mounted in or on the neck portion. A battery is disposed in the light bulb body, which powers the LEDs and which is charged by the one or more solar photovoltaic panels.

10 Claims, 3 Drawing Sheets

SOLAR LED LIGHT BULB

FIELD OF THE INVENTION

The present invention relates generally to lamps, and particularly to a lamp with a light-emitting diode (LED) light bulb, with a built-in solar collector.

BACKGROUND OF THE INVENTION

Outdoor solar lamps are known, such as for streets or gardens. These lamps generally consist of one or more solar modules, electrical storage means for storing electrical energy connected to the solar module and one or more bulbs that are illuminated by solar power.

Incandescent light bulbs are disadvantageous for use in such lamps. One reason is that incandescent light bulbs draw significant power, and since the lamp must work all night, the light bulb may not provide enough light towards the end of the night. The lifetime of the bulb is also shortened.

Solid state devices, such as light emitting diodes (LEDs), have been used to replace conventional light sources such as incandescent, halogen and fluorescent lamps. LEDs have substantially higher light conversion efficiencies than incandescent and halogen lamps and longer lifetimes than all three of these types of conventional light sources. Some LEDs have higher conversion efficiencies than fluorescent light sources. LEDs require lower voltages than fluorescent lamps and contain no mercury or other potentially dangerous materials, therefore, providing various safety and environmental benefits.

LED light bulbs are also known, that is, the light bulb is shaped like an incandescent light bulb but the light source is an array of LEDs mounted in the bulb.

Prior art solar-powered light bulbs are powered by a solar panel mounted separately from the light bulb.

SUMMARY OF THE INVENTION

The present invention seeks to provide an improved LED light bulb with a built-in solar collector, as is described more in detail hereinbelow.

There is thus provided in accordance with a non-limiting embodiment of the present invention a light bulb including a light bulb body including a bulbous portion that narrows into a neck portion, the neck portion extending into a base portion, an array of LEDs mounted in the bulbous portion, one or more solar photovoltaic panels mounted in or on the neck portion, and a battery disposed in the light bulb body that powers the LEDs and which is charged by the one or more solar photovoltaic panels.

In accordance with a non-limiting embodiment of the present invention the one or more solar photovoltaic panels face radially outwards about a central axis of the light bulb body, the central axis extending from the base portion through the neck portion to the bulbous portion.

In accordance with a non-limiting embodiment of the present invention the neck portion and the one or more solar photovoltaic panels are curved, for example, with similar curvatures.

In accordance with a non-limiting embodiment of the present invention the one or more solar photovoltaic panels include discrete solar photovoltaic panels spaced from one another about a central axis of the light bulb body, the central axis extending from the base portion through the neck portion to the bulbous portion.

In accordance with a non-limiting embodiment of the present invention the one or more solar photovoltaic panels include a single solar photovoltaic panel that curves around a central axis of the light bulb body, the central axis extending from the base portion through the neck portion to the bulbous portion.

In accordance with a non-limiting embodiment of the present invention the one or more solar photovoltaic panels extend from the base portion through the neck portion into part of the bulbous portion.

In accordance with a non-limiting embodiment of the present invention the base portion includes mounting structure for mounting the light bulb body to a support.

BRIEF DESCRIPTION OF THE DRAWINGS

The present invention will be understood and appreciated more fully from the following detailed description taken in conjunction with the drawings in which.

DETAILED DESCRIPTION OF EMBODIMENTS

Figure 1:
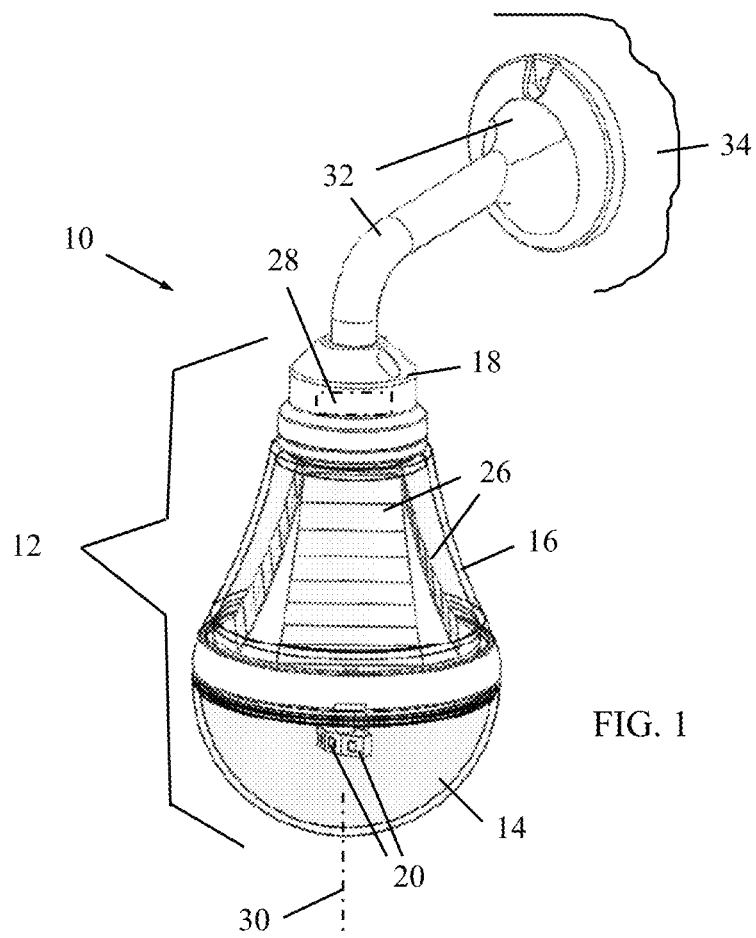
FIGS. 1 and 2 are simplified front and bottom perspective illustrations, respectively, of a solar light bulb, constructed and operative in accordance with a non-limiting embodiment of the present invention.
Figure 2:
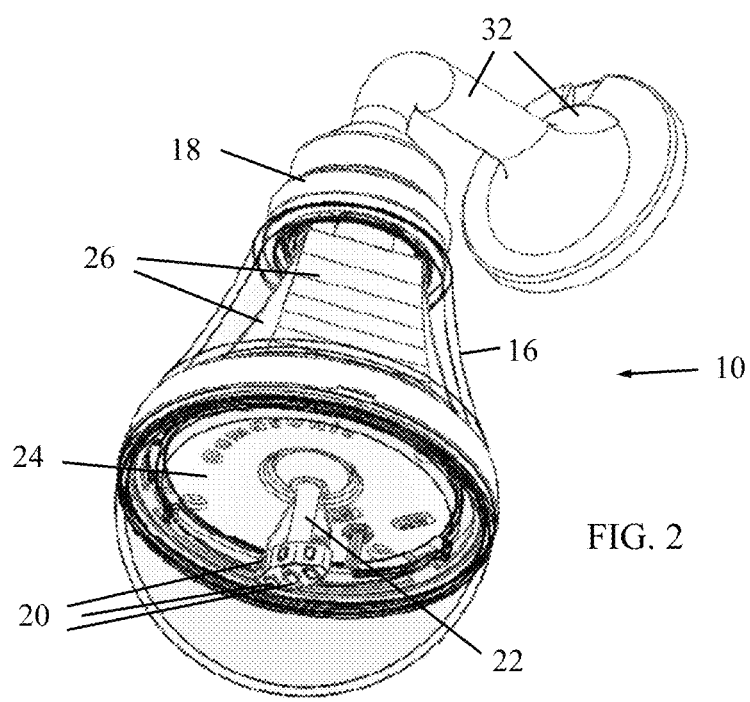

Reference is now made to FIGS. 1-2, which illustrate a light bulb 10, constructed and operative in accordance with a non-limiting embodiment of the present invention.

Light bulb 10 includes a light bulb body 12 including a bulbous portion 14 that narrows into a neck portion 16. The neck portion 16 extends into a base portion 18. The bulbous portion 14 is transparent or translucent.

An array of LEDs 20 is mounted in bulbous portion 14. For example, LEDs 20 may be mounted on a platform 22 (FIG. 2) supported by a central stem 24.

LEDs 20 may be of any size, mcd rating, and color (e.g., white, red, green, blue, yellow or other non-white colors, or a RGB (red, green, blue) changing LED, or any combination thereof). "White" is defined as the color that has no or little hue, due to the reflection of all or almost all incident light. "White" in the specification and claims encompasses bright white, warm white, "dirty" white, off-white, gray-white, snow white, hard-boiled-egg white and other shades of white. The colors of the lights may be programmed to change at predefined or random intervals, providing stunning lighting effects. LEDs 20 may be distributed in any mounting pattern on platform 22.

One or more solar photovoltaic panels 26 are mounted in or on neck portion 16. If mounted in neck portion 16, then neck portion 16 is preferably transparent. If mounted on neck portion 16, then neck portion 16 does not have to be transparent.

A battery or batteries 28 (FIG. 1) is/are disposed in the light bulb body 12 for powering the LEDs 20. The battery or batteries is/are charged by the one or more solar photovoltaic panels 26. Accordingly, the base portion 18 is not an electrical interface and does not screw into any socket; however, base portion 18 may be formed to give the appearance of a socket.

The solar photovoltaic panels 26 face radially outwards about a central axis 30 of the light bulb body 12. As seen in FIG. 1, the central axis 30 extends from base portion 18 through neck portion 16 to bulbous portion 14.

As seen in FIGS. 1 and 2, neck portion 16 and solar photovoltaic panels 26 are curved, for example, with similar curvatures (e.g., concave facing outwards). In the embodiment illustrated in FIGS. 1 and 2, there are discrete solar photovoltaic panels 26 that are spaced from one another about central axis 30.

Figure 5:
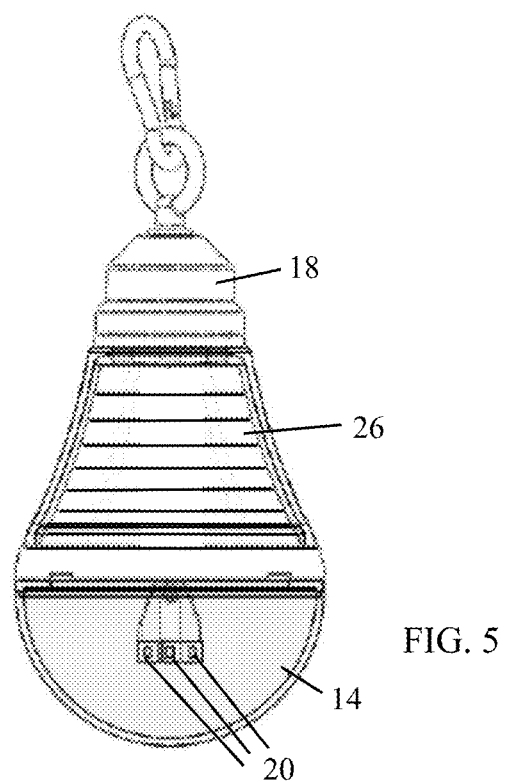
FIG. 5 is a simplified perspective illustration of the solar light bulb, constructed and operative in accordance with another non-limiting embodiment of the present invention, in which there is a solar panel that curves around the central axis of the light bulb body.

Alternatively, as seen in FIG. 5, there may be a single solar photovoltaic panel 26 that curves around central axis 30.

As seen in FIGS. 1 and 2, the solar photovoltaic panels 26 may extend from base portion 18 through neck portion 16 into part of bulbous portion 14. Alternatively, the solar photovoltaic panels 26 may extend from base portion 18 through neck portion 16 but not into any part of bulbous portion 14. Alternatively, the solar photovoltaic panels 26 may be completely disposed in neck portion 16 alone.

Figure 3:
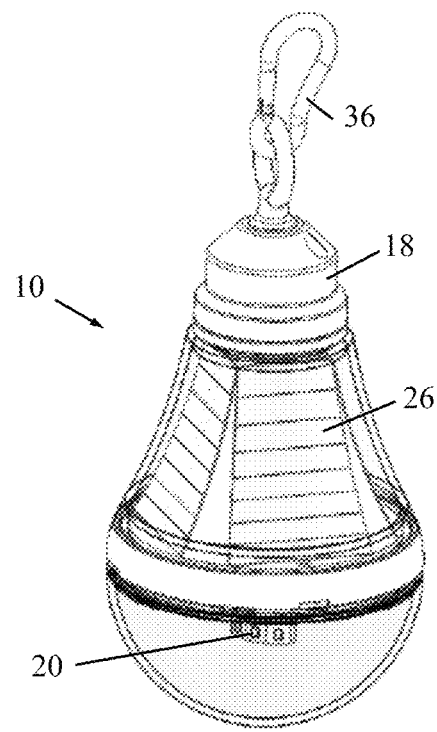
FIG. 3 is a simplified perspective illustration of the solar light bulb with a different mounting structure.

In accordance with a non-limiting embodiment of the present invention base portion 18 includes mounting structure for mounting the light bulb body 12 to a support. For example, in FIGS. 1 and 2, base portion 18 includes mounting structure 32 that includes a curved or bent arm (rigid or flexible) for mounting the light bulb body 12 to a support 34 (shown partially in broken lines), such as a wall. In FIG. 3, base portion 18 includes mounting structure 36 that includes a chain for mounting the light bulb body to a support. Many other mounting structures may be used.

Figure 4:
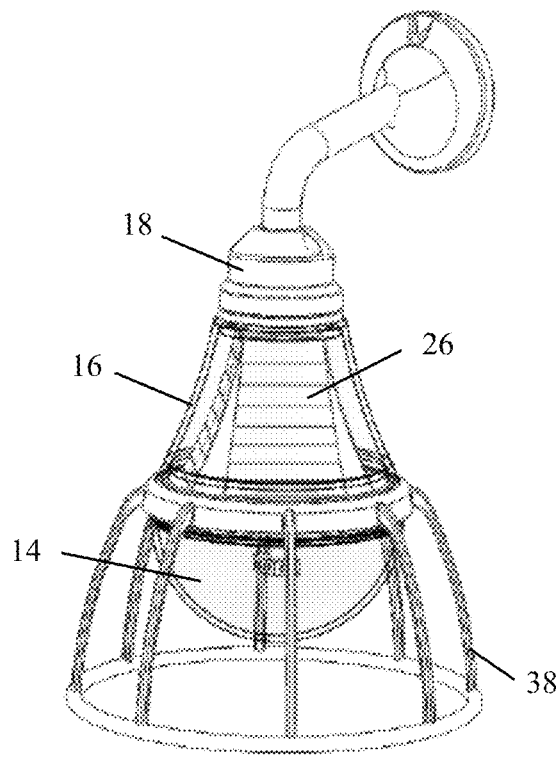
FIG. 4 is a simplified perspective illustration of the solar light bulb with a protective structure for the bulbous portion of the light bulb.

Reference is now made to FIG. 4, which illustrates the solar light bulb with a protective structure 38 for the bulbous portion 14 of the light bulb body. The protective structure 38 may be a cage that surrounds the bulbous portion 14 to protect it from breakage.

What is claimed is:

1. A light bulb comprising:
   a light bulb body comprising a bulbous portion that narrows into a neck portion, said neck portion extending into a base portion;
   an array of LEDs mounted in said bulbous portion;
   one or more solar photovoltaic panels mounted inside said neck portion; and
   a battery disposed in said light bulb body that powers said LEDs and which is charged by said one or more solar photovoltaic panels, and wherein said one or more solar photovoltaic panels extend from said neck portion into part of said bulbous portion.

2. The light bulb according to claim 1, wherein said one or more solar photovoltaic panels face radially outwards about a central axis of said light bulb body, the central axis extending from said base portion through said neck portion to said bulbous portion.

3. The light bulb according to claim 1, wherein said neck portion and said one or more solar photovoltaic panels are curved.

4. The light bulb according to claim 1, wherein said neck portion and said one or more solar photovoltaic panels are curved with similar curvatures.

5. The light bulb according to claim 1, wherein said one or more solar photovoltaic panels comprise discrete solar photovoltaic panels spaced from one another about a central axis of said light bulb body, the central axis extending from said base portion through said neck portion to said bulbous portion.

6. The light bulb according to claim 1, wherein said one or more solar photovoltaic panels comprise a single solar photovoltaic panel that curves around a central axis of said light bulb body, the central axis extending from said base portion through said neck portion to said bulbous portion.

7. The light bulb according to claim 1, wherein said one or more solar photovoltaic panels extend from said base portion through said neck portion into part of said bulbous portion.

8. The light bulb according to claim 1, wherein said base portion comprises mounting structure for mounting said light bulb body to a support.

9. A light bulb comprising:
   a light bulb body comprising a bulbous portion that narrows into a neck portion, said neck portion extending into a base portion;
   an array of LEDs mounted in said bulbous portion;
   one or more solar photovoltaic panels mounted inside said neck portion; and
   a battery disposed in said light bulb body that powers said LEDs and which is charged by said one or more solar photovoltaic panels, wherein said one or more solar photovoltaic panels face radially outwards about a central axis of said light bulb body, the central axis extending from said base portion through said neck portion to said bulbous portion.

10. A light bulb comprising:
    a light bulb body comprising a bulbous portion that narrows into a neck portion, said neck portion extending into a base portion;
    an array of LEDs mounted in said bulbous portion;
    one or more solar photovoltaic panels mounted inside said neck portion; and
    a battery disposed in said light bulb body that powers said LEDs and which is charged by said one or more solar photovoltaic panels, wherein said neck portion and said one or more solar photovoltaic panels are curved.

* * * * *